(12) United States Patent
Kawamura

(10) Patent No.: US 7,106,148 B2
(45) Date of Patent: Sep. 12, 2006

(54) BRANCHING FILTER AND COMMUNICATION DEVICE

(75) Inventor: Hideki Kawamura, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 69 days.

(21) Appl. No.: 11/042,979

(22) Filed: Jan. 25, 2005

(65) Prior Publication Data
US 2005/0174192 A1 Aug. 11, 2005

(30) Foreign Application Priority Data

Feb. 9, 2004 (JP) ............... 2004-031855
Dec. 17, 2004 (JP) ............... 2004-366069

(51) Int. Cl.
*H03H 9/00* (2006.01)
*H03H 9/54* (2006.01)

(52) U.S. Cl. ..................... 333/133; 333/189
(58) Field of Classification Search ........... 333/133, 333/186, 187, 189, 191, 192
See application file for complete search history.

(56) References Cited

U.S. PATENT DOCUMENTS 6,262,637 B1 * 7/2001 Bradley et al. ............ 333/133
6,897,740 B1 * 5/2005 Fujino et al. ............ 333/133
6,995,631 B1 * 2/2006 Taniguchi ............ 333/133
2006/0055485 A1 * 3/2006 Lobeek ............ 333/133

FOREIGN PATENT DOCUMENTS

| JP | 2001-024476 | 1/2001 |
| JP | 2003-022074 | 1/2003 |
| JP | 2003-163570 | 6/2003 |
| JP | 2003-347898 | 12/2003 |
| JP | 2004-007653 | 1/2004 |

* cited by examiner

*Primary Examiner*—Dean Takaoka
(74) *Attorney, Agent, or Firm*—Keating & Bennett, LLP

(57) ABSTRACT

A branching filter includes an antenna terminal, a transmission-side filter and a reception-side filter which are connected in parallel to the antenna terminal, and a matching circuit positioned between the antenna terminal and the reception-side filter. The reception-side filter is a ladder-type filter in which the frequency of a series resonator is higher than the antiresonant frequency of a parallel resonator. The transmission-side filter is a ladder-type filter and is the capacitance in the passband of the reception-side filter, and, because of the capacitance, the inductance of the impedance of the reception-side filter, when seen from the antenna terminal side, is reduced.

14 Claims, 16 Drawing Sheets

PARALLEL  SERIES
RESONATOR  RESONATOR

PARALLEL    SERIES
RESONATOR   RESONATOR freq (1.930GHz to 1.990GHz)

BRANCHING FILTER AND COMMUNICATION DEVICE

BACKGROUND OF THE INVENTION

1. Field of the Invention

The present invention relates to a branching filter suitable for use in communication devices such as portable telephones, and also relates to a communication device including the branching filter.

2. Description of the Related Art

In recent years, the technological progress in miniaturization and weight reduction of communication devices such as portable telephones has been remarkable. In order to realize such progress, not only reduction and miniaturization of components constituting the communication devices, but also development of composite components having plural functions has been ongoing. In particular, a high-performance branching filter used in the RF stage is required.

As a branching filter used in the RF stage as mentioned above, there is a branching filter using a ladder-type piezoelectric thin-film filter, as described in Japanese Unexamined Patent Application Publication No. 2001-24476 (publication date: Jan. 26, 2001). The ladder-type piezoelectric thin-film filter is constructed such that piezoelectric thin-film resonators functioning as a series resonator and a parallel resonator are arranged so as to define a ladder-type arrangement. The piezoelectric thin-film resonator contains a substrate having an opening portion or a concave portion and a vibrating portion in which at least a pair of an upper electrode and a lower electrode, which face each other, sandwich a thin-film portion having one or more piezoelectric thin-film layers formed on the opening portion or the concave portion.

In the filters constituting a branching filter, although dependent on applications, it is required that the attenuation on the lower-frequency side or the higher-frequency side of the passband be sharp. The branching filter contains a transmission-side filter and a reception-side filter and, although dependent on its application, there are cases in which the frequency spacing between the transmission-side filter and the reception-side filter is made very narrow. In that case, in the transmission-side filter positioned on a relatively lower-frequency side, the sharpness is required on the higher-frequency side close to the passband, and, in the reception-side filter positioned on a relatively higher-frequency side, the sharpness is required on the lower-frequency side close to the passband.

For example, in PCS in North America, the transmission band is 1850 MHz to 1990 MHz and the reception band is 1930 MHz to 1990 MHz. Both the transmission-side and reception-side passbands are as wide as 60 MHz, but the spacing (guard band) between the transmission band and the reception band is 20 MHz and this is only 1% of the carrier frequency. Since the sharpness of the filters is required to be in this range of 20 MHz, while considering the amount of frequency change due to temperature changes and manufacturing variations, filters having as sharp of characteristics as possible are required.

In the reception-side filter, a low insertion loss (for example, 3.0 dB or less) is required in the passband, and a high attenuation value (for example, 50 dB or more) is required in the other party's frequency band (passband of the transmission's side filter). Accordingly, a sharpness maintaining the attenuation value of 3.0 dB to 50 dB over 1930 MHz to 1910 MHz is required. Actually, since it is necessary to consider the amount of frequency change due to temperature changes and manufacturing variations, it is desirable that the amount of frequency change from 3.0 dB to 50 dB be about 10 MHz.

However, in the branching filter described in Japanese Unexamined Patent Application Publication No. 2001-24476, it was difficult to realize a branching filter having excellent characteristics in which a ladder-type piezoelectric thin-film filter having a wide passband and excellent sharpness outside the passband is provided.

In the ladder-type piezoelectric thin-film filter, the sharpness on the lower-frequency side close to the passband depends on the frequency spacing between the resonance frequency and the antiresonant frequency of the parallel resonator, and the sharpness on the higher-frequency side close to the passband depends on the frequency spacing between the resonance frequency and the antiresonant frequency of the series resonator. Therefore, the sharpness on the lower-frequency side and the higher-frequency side close to the passband can be improved by narrowing the frequency spacing between the resonance frequency and the antiresonant frequency of the parallel resonator or the series resonator.

The ladder-type thin-film filter described in Japanese Unexamined Patent Application Publication No. 2001-24476 is composed of piezoelectric thin-film resonators using a fundamental wave. Since the piezoelectric thin-film resonators using a fundamental wave have a large electromechanical coupling coefficient, it is difficult to narrow the frequency spacing between the resonance frequency and the antiresonant frequency of the piezoelectric thin-film resonators, and accordingly, it was difficult to improve the sharpness.

Furthermore, in the ladder-type piezoelectric thin-film filters, in order to obtain good characteristics in the passband, it is common to make the antiresonant frequency of the parallel resonator agree with the resonance frequency of the series resonator. However, in this case, since the passband is determined only by the frequency spacing between the resonance frequency and the antiresonant frequency of the parallel resonator and the frequency spacing between the resonance frequency and the antiresonant frequency of the series resonator, it was difficult to make the passband wider.

In particular, when, in order to obtain excellent sharpness outside the passband, the frequency spacing between the resonance frequency and the antiresonant frequency of the parallel resonator or the series resonator is narrowed and, in order to obtain excellent characteristics in the passband, the antiresonant frequency of the parallel resonator is made to agree with the resonance frequency of the series resonator, the passband is narrowed. In contrast with this, when, in order to widen the passband, the frequency spacing between the resonance frequency and the antiresonant frequency of the parallel resonator or the series resonator is widened and, in order to obtain excellent characteristics in the passband, the antiresonant frequency of the parallel resonator is made to agree with the resonance frequency of the series resonator, it becomes difficult to obtain excellent sharpness outside the passband.

SUMMARY OF THE INVENTION

In order to overcome the problems described above, preferred embodiments of the present invention provide a branching filter having filters in which the passband is widened and the sharpness on the lower-frequency side and/or the higher-frequency side close to the passband is increased, and having excellent isolation characteristics between the transmission and reception sides, and also provide a communication device including such a novel branching filter.

A branching filter according to a preferred embodiment of the present invention includes an antenna terminal, a first filter and a second filter having a passband higher than the passband of the first filter, both the first and second filters being connected to the antenna terminal, a matching circuit positioned between the antenna terminal and the second filter, at least one series resonator included in a series arm connecting an input terminal and an output terminal, and at least one parallel resonator included in at least one parallel arm connecting the series arm and a reference potential, the resonators being included in the first filter and second filter, respectively. In the branching filter, the second filter is a ladder-type filter in which the resonance frequency of the series resonator is higher than the antiresonant frequency of the parallel resonator, the impedance of a circuit in which the matching circuit is cascade-connected to the second filter is inductive in the passband of the second filter, when seen from the antenna-terminal side, the first filter is capacitive in the passband of the second filter, and, because of the capacitive impedance of the first filter, the inductive impedance of the second filter is reduced, when seen from the antenna-terminal side.

Then, generally the resonance frequency (resonance point) of the series resonator of the second filter is made to agree with the antiresonant frequency (antiresonant point) of the parallel resonator, but, in order to realize wider pass characteristics, the resonance frequency of the series resonator is shifted to the higher-frequency side. When constructed in this way, the impedance slips from the matching state to the capacitive state around the center frequency of the passband of the second filter.

When the characteristics of the second filter are seen from the antenna-terminal side, although the impedance is originally required to be in a matching state to have a fixed value, for example, 50 Ω in the passband of the second filter, the second filter actually becomes inductive. This is because the second filter is in a capacitive state and the phase is rotated by the matching circuit.

According to the construction of a preferred embodiment of the present invention, in the branching filter as a whole, it becomes possible that, when the characteristics of the second filter are seen from the antenna terminal side, the impedance becomes, for example, approximately 50 Ω in a matching state such that the first filter is made capacitive in the passband of the second filter and, as a result, the inductance of the second filter is reduced or preferably offset by the capacitance.

In the branching filter, a capacitance may be inserted between the first filter and the antenna terminal. In the branching filter, the series resonator and parallel resonator may include piezoelectric thin-film resonators, respectively.

In the branching filter, the piezoelectric thin-film resonator may include a substrate, and a vibrating portion, being acoustically separated from the substrate, in which at least a pair of upper and lower electrodes are arranged to face each other on the upper and lower surfaces of a thin-film portion having at least one layer of piezoelectric thin film so as to sandwich the thin-film portion.

In the branching filter, in the second filter, it is desirable that a piezoelectric thin-film resonator having an n-th harmonic (n is an integer of two or more) as the principal vibration be used at least in either of the series resonator and the parallel resonator.

According to the above-described unique construction, since the frequency spacing between the resonance frequency and the antiresonant frequency of resonators is narrow, for example, based on the antiresonant frequency of the parallel resonator, the resonance frequency of the series resonator in the second filter is shifted to the higher-frequency side such that at least one of the series resonator and the parallel resonator is a piezoelectric thin-film resonator having a n-th harmonic (n is an integer of two or more), for example, a second harmonic as the principal vibration. In this way, the passband of the second filter is widened and the attenuation outside the passband can be made sharp.

As a result, when constructed as described above, the passband is widened and at the same time the lower-frequency side and/or the higher-frequency side close to the passband can be made sharp. Accordingly, the isolation characteristics can be improved in each of the first and second filters.

In the branching filter, in the second filter, a piezoelectric thin-film resonator having a fundamental wave as the principal vibration is used in one of the series resonator and the parallel resonator, and a piezoelectric thin-film resonator having a second harmonic as the principal vibration may be used in the other of the series resonator and the parallel resonator.

According to the above-described unique construction, in the series resonator and parallel resonator, since the electro-mechanical coupling coefficient $k^2$ becomes different from each other when the principal vibration is made different, the frequency spacing between the resonance frequency and the antiresonant frequency of the parallel resonator can be made narrower by making small the electro-mechanical coupling coefficient $k^2$ of the piezoelectric thin-film resonator as a parallel resonator. In this way, in the above-described unique construction, the sharpness on the lower-frequency side close to the passband can be improved.

Furthermore, in contrast with the above, the frequency spacing between the resonance frequency and the antiresonant frequency of the series resonator can be made narrower by setting the electro-mechanical coupling coefficient $k^2$ of the piezoelectric thin-film resonator as a series resonator to be small. Thus, in the above-described unique construction, the sharpness on the higher-frequency side close to the passband can be improved.

Therefore, in the above-described unique construction, since the sharpness on the lower-frequency and higher-frequency sides close to the passband can be improved, the isolation characteristics can be improved in each of the first and second filters.

In the branching filter, in the piezoelectric thin-film resonator having a second harmonic as the principal vibration, it is desirable that an insulating film be provided between the substrate and the lower electrode and that the insulating film have an amount of frequency change due to temperature changes that is different from that of the piezoelectric thin film.

In the branching filter, the piezoelectric thin-film resonator having a second harmonic as the principal vibration may include an insulating film on the upper electrode. In the branching filter, it is desirable that the insulating film have an amount of frequency change due to temperature changes different from that of the piezoelectric thin film.

In the branching filter, an intermediate insulating film may be included between the upper electrode and the insulating film on the upper electrode. In the branching filter, the intermediate insulating film may be also formed on the upper electrode of the piezoelectric thin-film resonator having a fundamental wave as the principal vibration.

In the branching filter, insulating films of the same material are included on the upper electrode of the series resonator and the parallel resonator, respectively, and the insulating film on the upper electrode of the piezoelectric thin-film resonator having a second harmonic as the principal vibration may be thicker than the insulating film on the upper electrode of the piezoelectric thin-film resonator having a fundamental wave as the principal vibration.

In the branching filter, the series resonator and the parallel resonator each may include a surface acoustic wave resonator.

In a communication device according to another preferred embodiment of the present invention, at least one of the above branching filters is preferably included. According to the construction, a wide passband is provided and the communication characteristics can be improved by using the branching filter in which the attenuation on both sides close to the passband is sharp.

These and other features, elements, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to FIGS. 1 to 16.

First Preferred Embodiment

Figure 1:
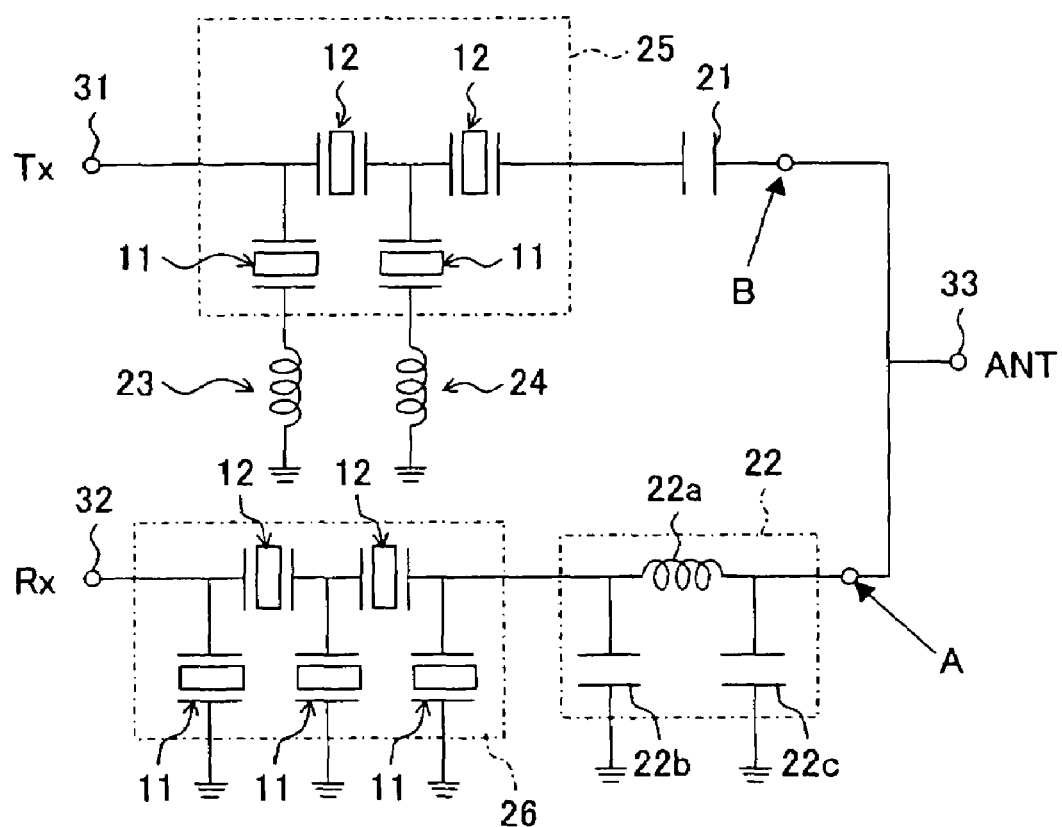
FIG. 1 is a circuit diagram of a branching filter according to a first preferred embodiment of the present invention.

FIG. 1 shows the circuit diagram of a branching filter of a first preferred embodiment of the present invention. In the present preferred embodiment, the passband of a transmission-side filter (first filter) is preferably about 1850 MHz to 1910 MHz and the passband of a reception-side filter (second filter), which is set to be higher than the passband of the transmission-side filter, is preferably about 1930 MHz to 190 MHz. The filters constitute a PCS branching filter.

As shown in FIG. 1, the branching filter according to the present preferred embodiment preferably includes a transmission-side (Tx) terminal 31, a reception-side (Rx) terminal 32, and an antenna (ANT) terminal 33. The branching filter includes a transmission-side filter 25 provided between the antenna terminal 33 and the transmission-side terminal 31, a reception-side filter 26 provided between the antenna terminal 33 and the reception-side terminal 32, and a matching circuit 22 provided between the antenna terminal 33 and the reception-side filter 26. That is, in the branching filter, the transmission-side filter 25 and the reception-side filter 26 are connected in parallel to the antenna terminal 33. The transmission-side filter 25 and the reception-side filter 26 are set to have different passbands from each other.

The transmission-side filter 25 is preferably a ladder-type piezoelectric thin-film filter including two series resonators 12 and two parallel resonators 11. Furthermore, the parallel resonators 11 are grounded through inductances 23 and 24 connected in series, respectively. The passband of the transmission-side filter 25 can be extended by the inductances 23 and 24. Furthermore, a capacitance 21 is connected in series between the transmission-side filter 25 and the antenna terminal 33.

The reception-side filter 26 is preferably a ladder-type piezoelectric thin-film filter including two series resonators 12 and three parallel resonators 11. Furthermore, the parallel resonators 11 are grounded.

In the branching filter, when a signal is transmitted, the transmission signal is required to pass through from the transmission-side terminal 31 to the antenna terminal 33 in the passband of the transmission-side filter 25. When the signal is transmitted, the circuit disposed from point A shown in FIG. 1 to the reception-side terminal 32, that is, the reception-side filter 26, is unnecessary, and it is desirable that the impedance when the reception-side terminal 32 is seen from point A be close to infinity in the passband of the transmission-side filter 25. The matching circuit 22 realizes this feature. The matching circuit 22 includes an inductance 22a which is connected in series and two capacitances 22b and 22c which are connected in parallel.

Figure 2A:
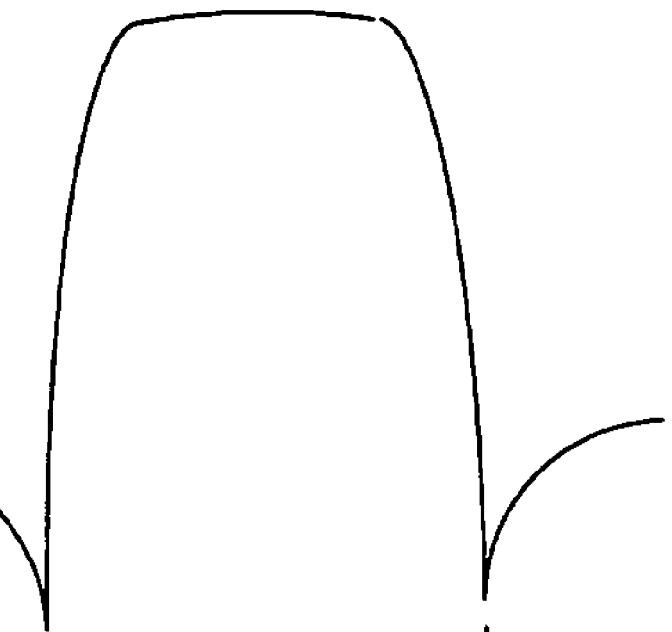
FIG. 2A shows frequency characteristics of a ladder-type piezoelectric thin-film filter included in the branching filter.
Figure 2B:
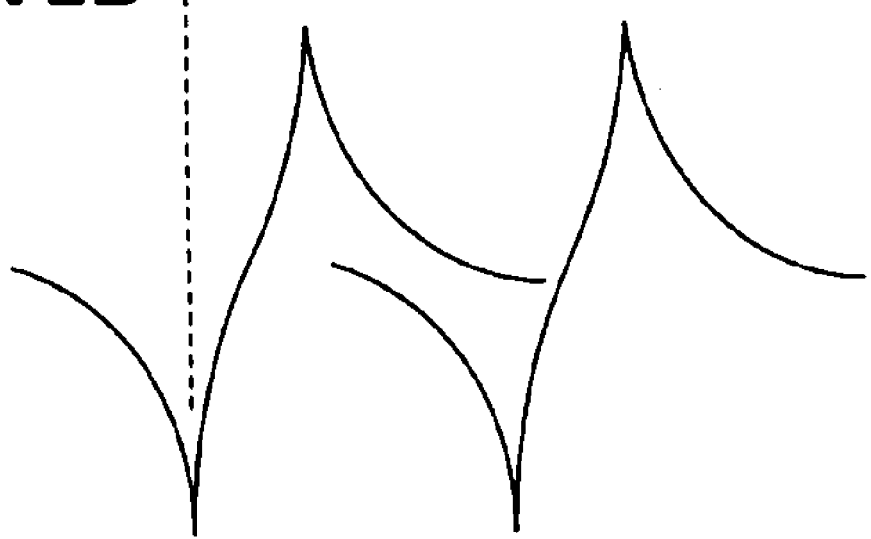
FIG. 2B shows the impedance characteristics of the parallel resonator and series resonator in the ladder-type piezoelectric thin-film filter included in the branching filter.

FIGS. 2A and 2B schematically show the frequency characteristics of the series resonators 12 and parallel resonators 11 of the reception-side filter 26. A wide passband is realized such that, as shown in FIGS. 2A and 2B, the resonance frequency of the series resonators 12 is set to be higher than the antiresonant frequency of the parallel resonators 11.

Generally, in a ladder-type filter, after the antiresonant frequency of the parallel resonators has been made to agree with the resonance frequency of the series resonators, a bandpass filter is arranged such that the resonance frequency of the parallel resonators makes an attenuation pole on the lower-frequency side close to the passband and the antiresonant frequency of the series resonators makes an attenuation pole on the higher-frequency side close to the passband. With such a construction, unless resonators in which the frequency spacing between the resonance frequency and the antiresonant frequency is large are used, the passband cannot be widened. On the other hand, in order to widen the passband, when resonators having a wide frequency spacing between the resonance frequency and the antiresonant frequency are used, there is a problem in that the sharpness of the passband is worsened. Accordingly, in a normal ladder-type filter, it is difficult to keep the sharpness and simultaneously to widen the passband.

In the reception-side filter 26 according to the present preferred embodiment, since the resonance frequency of the series resonators 12 is set to be higher than the antiresonant frequency of the parallel resonators 11, even if resonators having a narrow frequency spacing between the resonance frequency and the antiresonant frequency are used in order to improve the sharpness, the passband can be widened.

Figure 3:
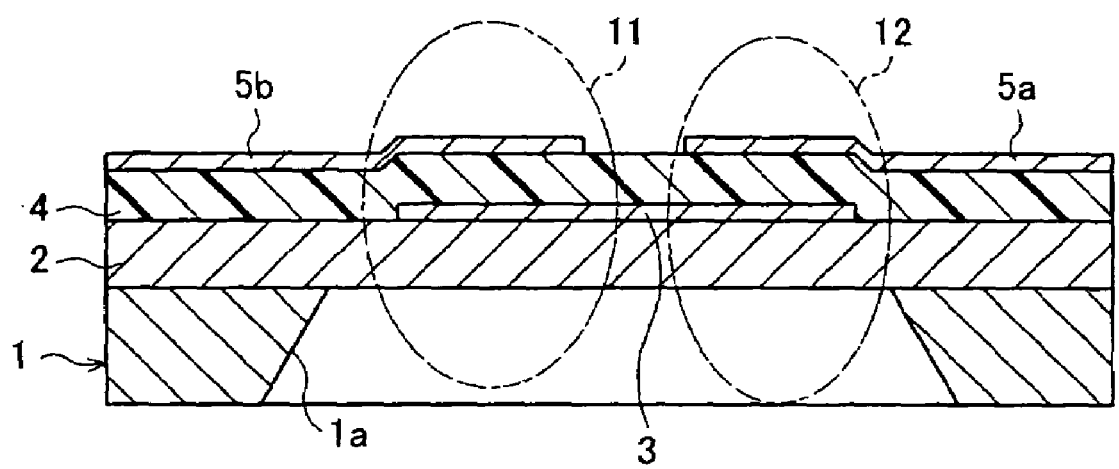
FIG. 3 is a sectional view of the essential portion of the ladder-type piezoelectric thin-film filter.

In FIG. 3, a sectional view of the reception-side filter 26 is shown. The reception-side filter 26 is a ladder-type piezoelectric thin-film filter in which a plurality of piezoelectric thin-film filters are combined to define the series resonators 12 and parallel resonators 11.

The piezoelectric thin-film filter is constructed such that, on an Si substrate 1 having an opening portion 1a, an SiO$_2$ insulating film 2 formed on the opening portion 1a, an Al lower electrode 3 on the insulating film 2, an AlN piezoelectric thin film 4, and upper electrodes 5a and 5b are arranged in order. In the piezoelectric thin-film filter, a vibrating portion (diaphragm) of the piezoelectric thin-film filter is defined by the lower electrode 3 and the upper electrodes 5a and 5b sandwiching the piezoelectric thin film 4 and a portion of the insulating film 2 facing those on the opening portion 1a. The vibrating portion is acoustically separated from the Si substrate 1 such that the vibrating portion is formed on such an opening portion 1a or a concave portion to be described later.

The insulating film 2 made of SiO$_2$ may be formed by oxidizing an Si substrate using heat, etc., or by sputtering, or other suitable method. Furthermore, instead of the insulating film 2 made of SiO$_2$, a laminated film of SiO$_2$ and AlN or a laminated film of SiO$_2$ and Al$_2$O$_3$ may be used as an insulating film (not illustrated).

Furthermore, in the present preferred embodiment, although the piezoelectric thin film 4 made of AlN is preferably used, the present invention is not limited to this and a piezoelectric thin film made of ZnO may be used. Moreover, in the present preferred embodiment, although the electrodes made of Al are used, the present invention is not limited to this and Cu, Mo, Pt, Ir, Ta, W, Au, Ag, or alloys thereof may be used.

The reception-side filter 26 of the present preferred embodiment preferably includes piezoelectric thin-film resonators in which a second harmonic is the principal vibration. Moreover, since the vibration energy is easily maintained, a second harmonic is desirable as the principal vibration, but an n-th order harmonic (n is an integer of two or more) may be used.

In the piezoelectric thin-film resonator whose second harmonic is the principal vibration, since the vibration energy is transmitted outside the piezoelectric film (to the insulating film), the electro-mechanical coupling coefficient $k^2$ becomes small and the frequency spacing between the resonance frequency and the antiresonant frequency can be narrowed. Thus, in the reception-side filter 26 of the present preferred embodiment, the attenuation value can be made sharp on the lower-frequency side and on the higher-frequency side close to the passband.

Moreover, in the piezoelectric thin-film resonator whose second harmonic is the principal vibration, although the fundamental wave also exists together with the second harmonic, since the frequency is far below the second harmonic as the principal vibration, there is no problem in the frequency characteristics of the ladder-type piezoelectric thin-film filter.

Furthermore, in the present preferred embodiment, since the piezoelectric thin-film resonator is constituted by a combination of a piezoelectric thin film 4 made of AlN having a negative temperature coefficient and an insulating film 2 made of SiO$_2$ having a positive temperature coefficient, the amount of frequency change due to temperature changes is reduced and the temperature characteristics can be improved.

Moreover, it is experimentally made clear that the temperature coefficient of an SiO$_2$ film in which an Si substrate is oxidized is about five times as large as the temperature coefficient of an SiO$_2$ film formed by sputtering. In order to improve the temperature characteristics by offsetting the negative temperature coefficient of AlN, since there are cases in which an SiO$_2$ film formed by sputtering is insufficient, it is desirable to use a laminated film of an SiO$_2$ film formed by sputtering and an SiO$_2$ film formed by thermal oxidation.

Figure 4A:
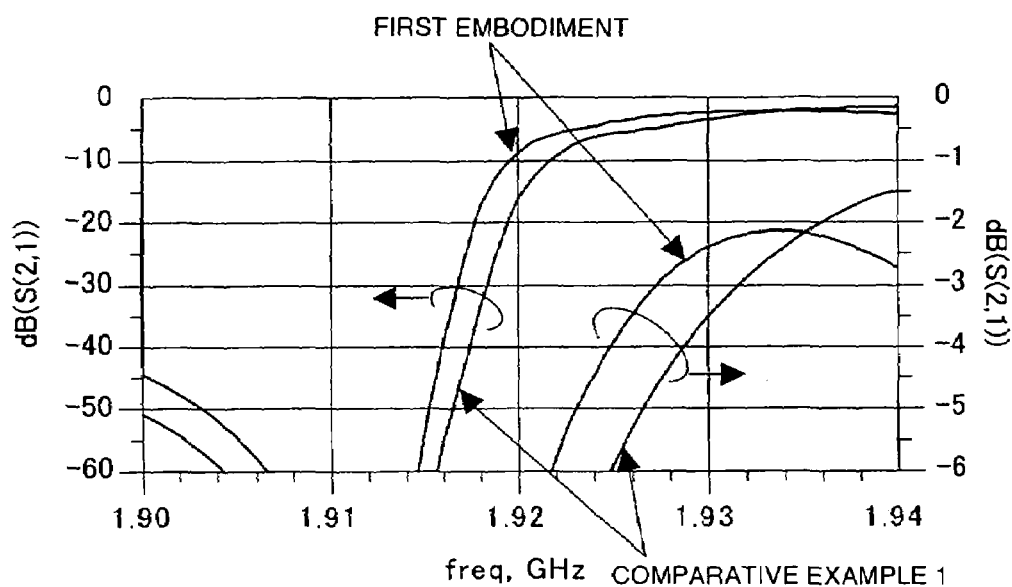
FIG. 4A shows the lower-frequency side of the passband and the outside of the passband in frequency characteristics of the ladder-type piezoelectric thin-film filter.
Figure 4B:
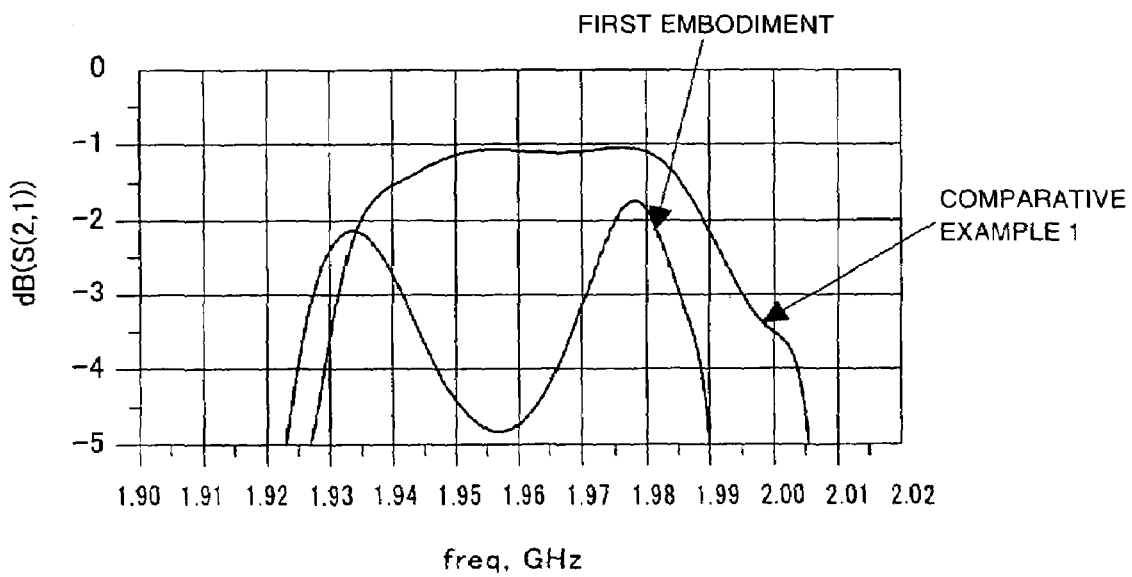
FIG. 4B shows the passband in frequency characteristics of the ladder-type piezoelectric thin-film filter.

In FIG. 4A, the frequency characteristics on the lower-frequency side close to the passband when the reception-side filter 26 of the present preferred embodiment was independently measured are shown. In FIG. 4B, the frequency characteristics of the passband when the reception-side filter 26 was independently measured are shown. In the reception-side filter 26 of the present preferred embodiment, the frequency spacing between the resonance frequency and the antiresonant frequency of the piezoelectric thin-film resonator is about 32 MHz. In FIGS. 4A and 4B, the characteristics of a ladder-type piezoelectric thin-film filter having the same passband of 1930 MHz to 1990 MHz as in the reception-side filter of the present preferred embodiment are shown as comparative example 1. In the ladder-type piezoelectric thin-film filter serving as comparative example 1, a piezoelectric thin-film resonator in which a fundamental wave is the principal vibration and the frequency spacing between the resonance frequency and the antiresonant frequency of the series resonator is about 52 MHz is used.

In the ladder-type piezoelectric thin-film filter serving as comparative example 1, both the series resonator and parallel resonator have a construction in which, on a substrate having an opening portion, a lower electrode made of Al, a piezoelectric thin film made of AlN, and an upper electrode made of Al are formed on the opening portion in this order.

Here, roll-off was measured as a characteristic indicating sharpness. The roll-off is defined as a range of frequencies required for the transition of insertion loss from about 3 dB to about 50 dB.

As is clearly seen in FIG. 4A, although the roll-off in the comparative example 1 is 16 MHz, the roll-off in the present preferred embodiment is reduced to about 12 MHz. That is, it is understood that the frequency characteristic on the lower-frequency side close to the passband is sharp.

However, in the reception-side filter 26 of the present preferred embodiment, as is clearly seen in FIG. 4B, although the sharpness is improved on both the lower-frequency and higher-frequency sides close to the passband, the insertion loss is deteriorated in the middle of the passband to generate a concave portion. This is because, in order to improve the sharpness, the resonator's electro-mechanical coupling coefficient $k^2$ is reduced in both the series resonators and parallel resonators and a piezoelectric thin-film resonator of a second harmonic in which the frequency spacing between the resonance frequency and the antiresonant frequency is narrow is used.

In the comparative example 1, because a piezoelectric thin-film resonator in which the fundamental wave is made the principal vibration and the frequency spacing between the resonance frequency and the antiresonant frequency is as wide as 52 MHz is used, a wide passband is realized such that the antiresonant frequency of the parallel resonators is made in agreement with the resonant frequency of the series resonators, and at the same time the characteristics in the passband are improved, but the frequency characteristics on the lower-frequency side close to the passband cannot be made sharp.

On the other hand, in the reception-side filter 26 of the present preferred embodiment, because a piezoelectric thin-film resonator in which the second harmonic is made the principal vibration and the frequency spacing between the resonance frequency and the antiresonant frequency of the series resonators is made as narrow as about 32 MHz is used, as shown in FIG. 2, the resonance frequency of the series resonators 12 is set to be higher than the antiresonant frequency of the parallel resonators 11 in order to realize a desired passband. As a result, although a wide passband is realized and at the same time the frequency characteristics in the lower-frequency and higher-frequency sides close to the passband can be made sharp, the insertion loss in the middle portion of the passband is worsened to generate a concave portion, and the characteristics are thus worsened.

In the case of the transmission-side filter 25 having the passband on the relatively lower-frequency side, even if the filter 25 is constructed in the same way as the reception-side filter 26 of the present preferred embodiment, when the passband is extended toward the lower-frequency side such that inductances 23 and 24 are connected in series to the parallel resonators 11, respectively, the insertion loss in the middle portion of the passband can be prevented from worsening.

However, in the case of the reception-side filter 26 having the passband on the relatively higher-frequency side, when the passband is extended toward the lower-frequency side such that inductances are connected in series to the parallel resonators 11 of the reception-side filter 26, the filter 26 interferes with the transmission-side filter 25. Accordingly, such a method cannot be used and it is necessary to use other means to solve the above-described problem.

In the reception-side filter 26, the insertion loss is worsened in the middle portion of the passband and a concave portion is generated. Then, regarding the causes of the concave portion, the following investigation was performed.

Figure 5:
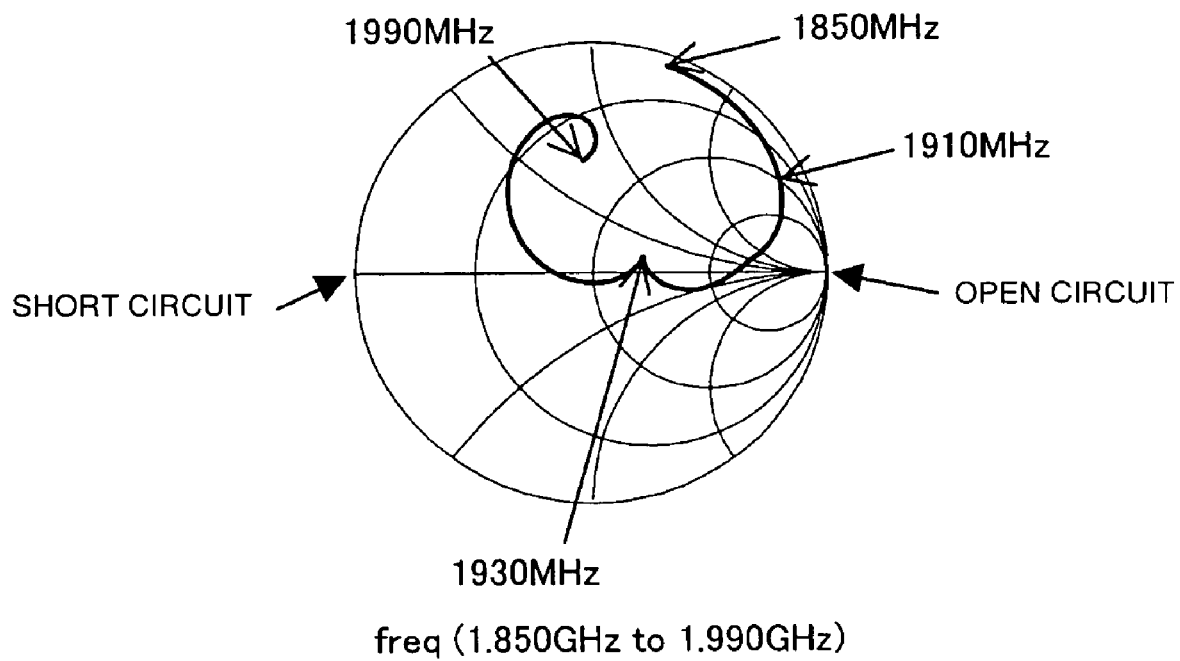
FIG. 5 is a Smith chart showing reflection characteristics when the reception-side terminal is seen from point A in the branching filter.

FIG. 5 shows the reflection characteristics when the circuit of the branching filter is cut at point A in FIG. 1 and the reception-side terminal 32 is seen from point A. The terminal at point A is made open-circuited in the passband (1850 MHz to 1910 MHz) of the transmission-side filter 25. That is, the impedance is close to infinity and it is understood that the impedance has increased.

On the other hand, as is shown in FIG. 5, the reception-side filter 26 of the present preferred embodiment is originally required to be in a matching state in the middle of the graph in the passband (1930 MHz to 1990 MHz) of the reception-side filter 26, but the filter 26 has actually shifted to the inductive state. It is understood that this is the cause of the worsened insertion loss in the middle portion of the passband and the generation of the concave portion.

In the passband of the reception-side filter of the branching filter, when the impedance is about 50 Ω, the reception filter 26 is in a matching state and the transmission-side filter 25 is open-circuited, that is, the impedance is close to infinity. On the other hand, in the passband of the transmission-side filter 25, the reception-side filter is open-circuited, that is, the impedance is close to infinity, and the transmission-side filter 25 is in a matching state and the impedance is about 50 Ω. Generally the above situation is considered to be ideal.

However, the reception-side filter 26 is shifted to the inductive state in the passband of the reception-side filter 26, which is caused by the following.

The piezoelectric thin-film resonator is capacitive in the frequency area lower than the resonance frequency, inductive in the frequency area between the resonance frequency and the antiresonant frequency, and capacitive in the frequency area higher than the antiresonant frequency.

In the reception-side filter 26 of the present preferred embodiment, in order that the frequency characteristics on the lower-frequency side and the higher-frequency side close to the passband may be made sharp and a desired passband may be realized, as shown in FIG. 2, the resonance frequency of the series resonators 12 is made higher than the antiresonant frequency of the parallel resonators. As a result, the frequency area in which the piezoelectric thin-film resonator is capacitive is dominant in the passband. Accordingly, the reception-side filter 26 of the present preferred embodiment becomes capacitive in the passband of the reception-side filter 26.

Furthermore, as shown in FIG. 1, the matching circuit 22 is disposed between the reception-side filter 26 and the antenna terminal 33. Since the phase seems to be rotated because of this matching circuit 22, the reflection characteristics when the reception terminal is seen from point A become inductive in the passband of the reception-side filter 26.

Then, in the present preferred embodiment, a filter in which the reflection characteristics are capacitive in the passband of the reception-side filter 26 is used as the transmission-side filter 25. More specifically, a ladder-type piezoelectric thin-film filter having the same construction as that of the reception-side filter 26 is preferably used as the transmission-side filter 25.

Figure 6:
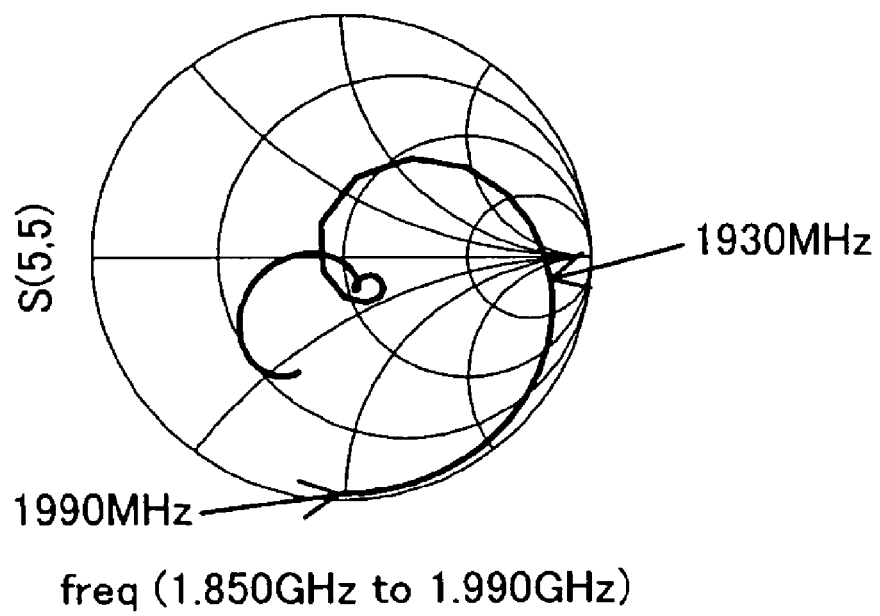
FIG. 6 is a Smith chart showing reflection characteristics when the transmission-side terminal 31 is seen from point B in the branching filter.

In FIG. 6, the reflection characteristics when the circuit in FIG. 1 is cut at point B and the transmission-side terminal 31 is seen from point B is shown. It is open-circuited over the passband (1930 MHz to 1990 MHz) of the reception-side filter 26, that is, it is understood that the impedance is shifted from being close to infinity to the capacitive.

Accordingly, in the passband of the reception-side filter 26, when a receiving signal passes through from the antenna terminal to the reception-side terminal 32 in the passband in reception, the problem in that the impedance in the reception-side filter 26 of the present preferred embodiment is shifted to the inductive state as shown in FIG. 5 is minimized and preferably solved such that the capacitive impedance when the transmission-side terminal 31 is seen from point B is inserted so as to be parallel to the antenna terminal 33, that is, the inductance is reduced by the capacitance and preferably the inductance is canceled.

Figure 7:
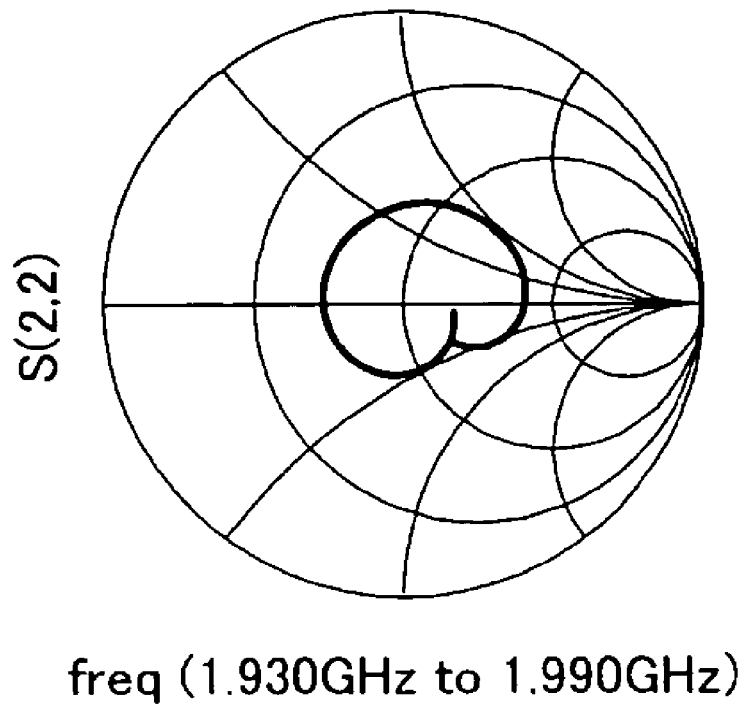
FIG. 7 is a Smith chart showing reflection characteristics in the passband of the reception-side filter when seen from the antenna terminal of the branching filter.

In FIG. 7, the reflection characteristics in the passband of the reception-side filter 26, when seen from the antenna terminal 33, is shown. The reflection characteristics encircle substantially the center of the graph in the passband of the reception-side filter 26, and it is understood that the reflection characteristics are in a matching state. Thus, the concave portion in the middle of the passband of the reception-side filter 26 due to the insertion loss can be improved.

Normally, in the passband of the reception-side filter 26, when the transmission-side terminal 31 is seen from portion B, the transmission-side filter 25 which is open-circuited, that is, in which the impedance is substantially infinity is used. But, in the present preferred embodiment, in order to realize a wide passband, the resonance frequency of the series resonators 12 is set to be higher than the antiresonant frequency of the parallel resonators 11. Because of this, in the passband of the reception-side filter 26, the insertion loss is worsened in the middle of the passband to cause the concave portion, and the reflection characteristics are shifted to the inductive state.

Then, in the branching filter of a preferred embodiment of the present invention, instead of using the reception-side filter 26, the transmission-side filter 25 which is open-circuited in the passband of the reception-side filter 26, that is, in which the impedance is shifted from the state being substantially infinity to the capacitive state, is preferably used.

In this way, a branching filter having excellent characteristics can be realized by using a piezoelectric thin-film filter having a wide passband and sharp attenuation characteristics in the vicinity of the passband.

Moreover, in FIG. 6, the amount of shifting to the capacitive state in the passband (1930 MHz to 1990 MHz) of the reception-side filter 26 can be adjusted by the capacitance 21 connected in series between the transmission-side filter 25 and the antenna terminal 33.

Hereinafter, a modified example of the reception-side filter 26 of the present preferred embodiment is shown.

Figure 8:
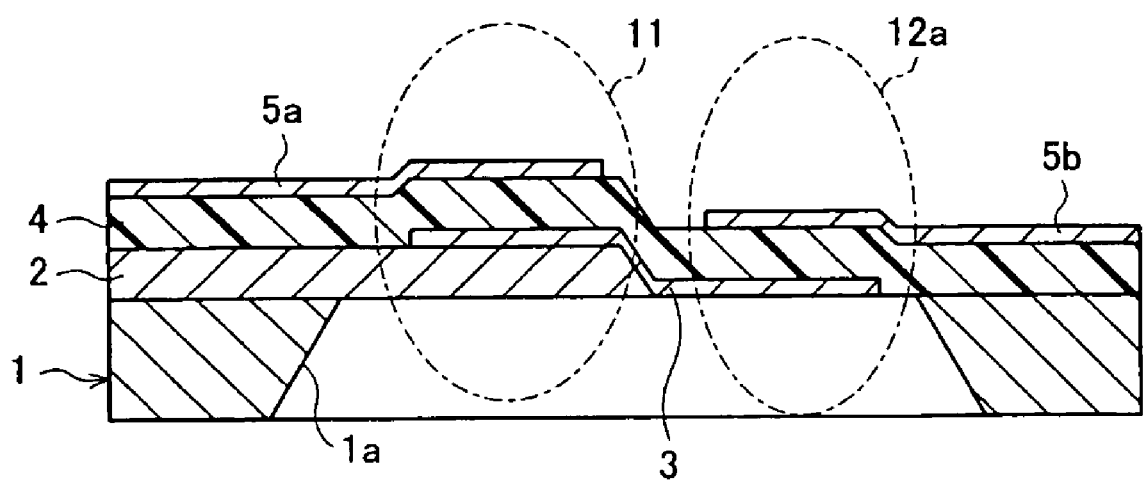
FIG. 8 is a sectional view of the essential portion of one modified example of the ladder-type piezoelectric thin-film filter.

As shown in FIG. 8, in the modified example of the reception-side filter 26 of the present preferred embodiment, instead of the series resonators 12 having a second harmonic as the principal vibration described in the first preferred embodiment, a series resonator 12a in which the fundamental wave is the principal vibration is used and a ladder-type piezoelectric thin-film filter includes a combination of a parallel resonator 11 and a series resonator 12a.

The parallel resonator 11 has a construction in which, on the Si substrate 1 having the opening portion 1a, the insulating film 2 made of SiO$_2$ formed on the opening portion 1a, the lower electrode 3 made of Al on the insulating film 2, the piezoelectric thin film 4 made of AlN, and the upper electrode 5a made of Al are formed in this order, and a second harmonic is the principal vibration, and is a piezoelectric thin-film resonator in which a second harmonic is the principal vibration.

On the other hand, the series resonator 12a has a construction in which, on the Si substrate 1 having the opening portion 1a, the lower electrode 3 made of Al which is formed on the opening portion 1a, the piezoelectric thin film 4 made of AlN, and an upper electrode 5b made of Al are formed in this order, and is a piezoelectric thin-film resonator in which the insulating film 2 of the parallel resonator 11 is omitted and a fundamental wave is the principal vibration.

In the construction of the present modified example, the difference in resonance frequency between the series resonator 12a and the parallel resonator 11 can be realized by the insulating film 2. Accordingly, the thicknesses of all of the lower electrode 3, the upper electrodes 5a and 5b, and the piezoelectric thin film 4 are the same and they can be produced in the same process, and accordingly the manufacture of them is easy.

The SiO$_2$ insulating film 2 made of the parallel resonator 11 may be formed by oxidizing the Si substrate by thermal oxidation, etc., or by sputtering. Furthermore, instead of the insulating film made of SiO$_2$, a laminated film of SiO$_2$ and AlN, or a laminated film of SiO$_2$ and Al$_2$O$_3$ may be used as an insulating film.

Furthermore, in FIG. 8, although the insulating film 2 made of SiO$_2$ is preferably formed only in the parallel resonator 11, the same insulating film (not illustrated) may be formed in the series resonator 12a. Moreover, in the construction shown in FIG. 8, an upper insulating film (not illustrated) made of the same material may be further formed on the upper electrodes 5a and 5b of the series resonator 12a and the parallel resonator 11. The frequency adjustment of the series resonator 12a and the parallel resonator 11, that is, the frequency adjustment of the ladder-type piezoelectric thin-film filter can be adjusted by etching the upper insulating film.

Furthermore, in the construction shown in FIG. 8, the upper insulating films (not illustrated) made of different materials may be further formed on the upper electrodes 5a and 5b of the series resonator 12a and the parallel resonator 11, respectively. The frequency adjustment of one of the series resonator 12a and parallel resonator 11 can be made by etching the upper insulating films.

The ladder-type piezoelectric thin-film filter shown in FIG. 8 is characterized in that a piezoelectric thin-film resonator having a second harmonic of a relatively narrow frequency spacing between the resonance frequency and the antiresonant frequency as the principal vibration is used in the parallel resonator 11 and that a piezoelectric thin-film resonator having a fundamental wave of a relatively wide frequency spacing between the resonance frequency and the antiresonant frequency as the principal vibration is used in the series resonator 12a.

Since the parallel resonator 11 is a piezoelectric thin-film resonator having a second harmonic as the principal vibration, the vibration energy is conveyed outside the piezoelectric film (here to the insulating film 2) and the electromechanical coupling coefficient $k^2$ becomes small. As a result, the frequency spacing between the resonance frequency and the antiresonant frequency can be reduced. In this way, the attenuation value on the lower-frequency side close to the passband can be made sharp. In the same way as the ladder-type piezoelectric thin-film filter shown in FIG. 3, a wide passband can be realized such that the resonance frequency of the series resonator 2a is made higher than the antiresonant frequency of the parallel resonator 11.

Moreover, in the parallel resonator 11 functioning as a piezoelectric thin-film resonator in which a second harmonic is the principal vibration, although the fundamental wave is also vibrated together with the second harmonic, since the frequency is much lower than the frequency of the second harmonic as the principal vibration, there is no problem in the frequency characteristics of the ladder-type piezoelectric thin-film filter.

Furthermore, in the ladder-type piezoelectric thin-film filter shown in FIG. 8, since the parallel resonator 11 is constructed by a combination of the piezoelectric thin film 4 made of AlN having a negative temperature coefficient and the insulating film 2 made of $SiO_2$ having a positive temperature coefficient, the amount of frequency change due to temperature changes is reduced and, in particular, the temperature characteristics on the lower-frequency side close to the passband can be improved.

Moreover, experimentally, it has been made clear that the temperature coefficient of an $SiO_2$ film produced by oxidation of the Si substrate 1 is about five times as large as the temperature coefficient of an $SiO_2$ film formed by sputtering. In order to offset the negative temperature coefficient of AlN and improve the temperature characteristics, there are cases in which an $SiO_2$ film formed by sputtering is insufficient, and then, it is desirable to use a laminated film of an $SiO_2$ film formed by thermal oxidation or sputtering and an $SiO_2$ film formed by thermal oxidation.

Figure 9:
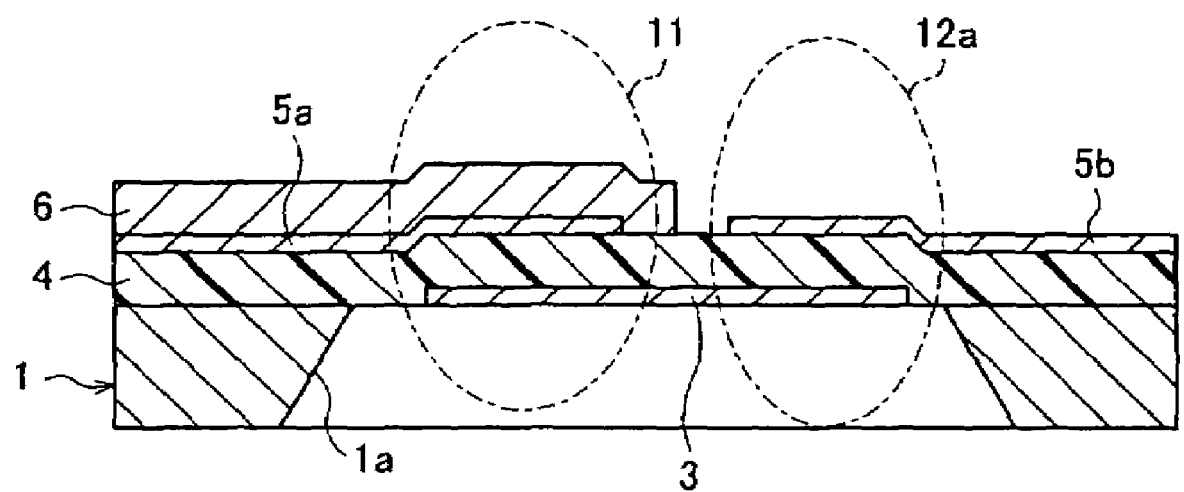
FIG. 9 is a sectional view of the essential portion of another modified example of the ladder-type piezoelectric thin-film filter.

FIG. 9 shows a piezoelectric thin film in which an insulating film 2 made of $SiO_2$ is not formed on the opening portion 1a in the parallel resonator 11 of the ladder-type piezoelectric thin-film filter shown in FIG. 8 and an upper insulating film 6 made of $SiO_2$ is formed on the upper electrode 5a. In this construction, since the insulating film 2 made of $SiO_2$ is not formed on the opening portion 1a, there is no difference in level on the piezoelectric thin film 4 and the lower electrode 3. Accordingly, the diaphragm becomes hard to break and the manufacturing yield increases.

Moreover, in this structure, a thin insulating film (not illustrated) made of any one of $SiO_2$, SiN, ZnO, and AlN may be formed on the opening portion 1a so as to be spread over both the parallel resonator 11 and the series resonator 12a.

Figure 10:
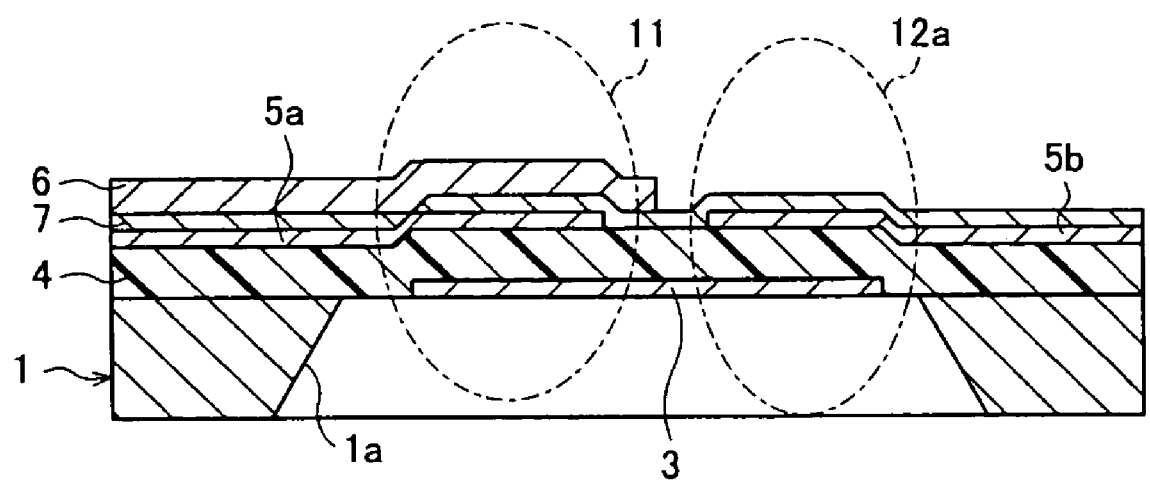
FIG. 10 is a sectional view of the essential portion of another modified example of the ladder-type piezoelectric thin-film filter.

In a filter in FIG. 10, a protective film 7 is further formed under the upper insulating film 6 in the modified example shown in FIG. 9. With such a construction, when the upper insulating film 6 is formed by etching after a film has been formed on the whole surface, the protective film 7 made of a material that is not affected by the etching of the upper insulating film 6 can prevent the piezoelectric thin film 4 and the upper electrodes 5a and 5b from receiving damage by the etching. Furthermore, when the protective film 7 is formed on both the series resonator 12a and the parallel resonator 11, by using the difference in etching rate of the upper insulating film 6 and he protective film 7, the frequency adjustment of the series resonator 12a and the parallel resonator 11 can be separately made.

Figure 11:
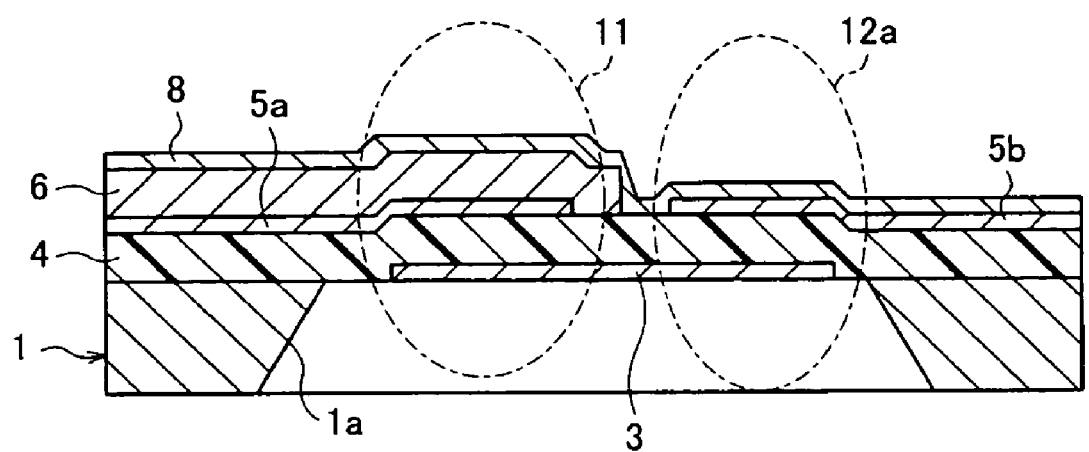
FIG. 11 is a sectional view of the essential portion of another modified example of the ladder-type piezoelectric thin-film filter.
Figure 12:
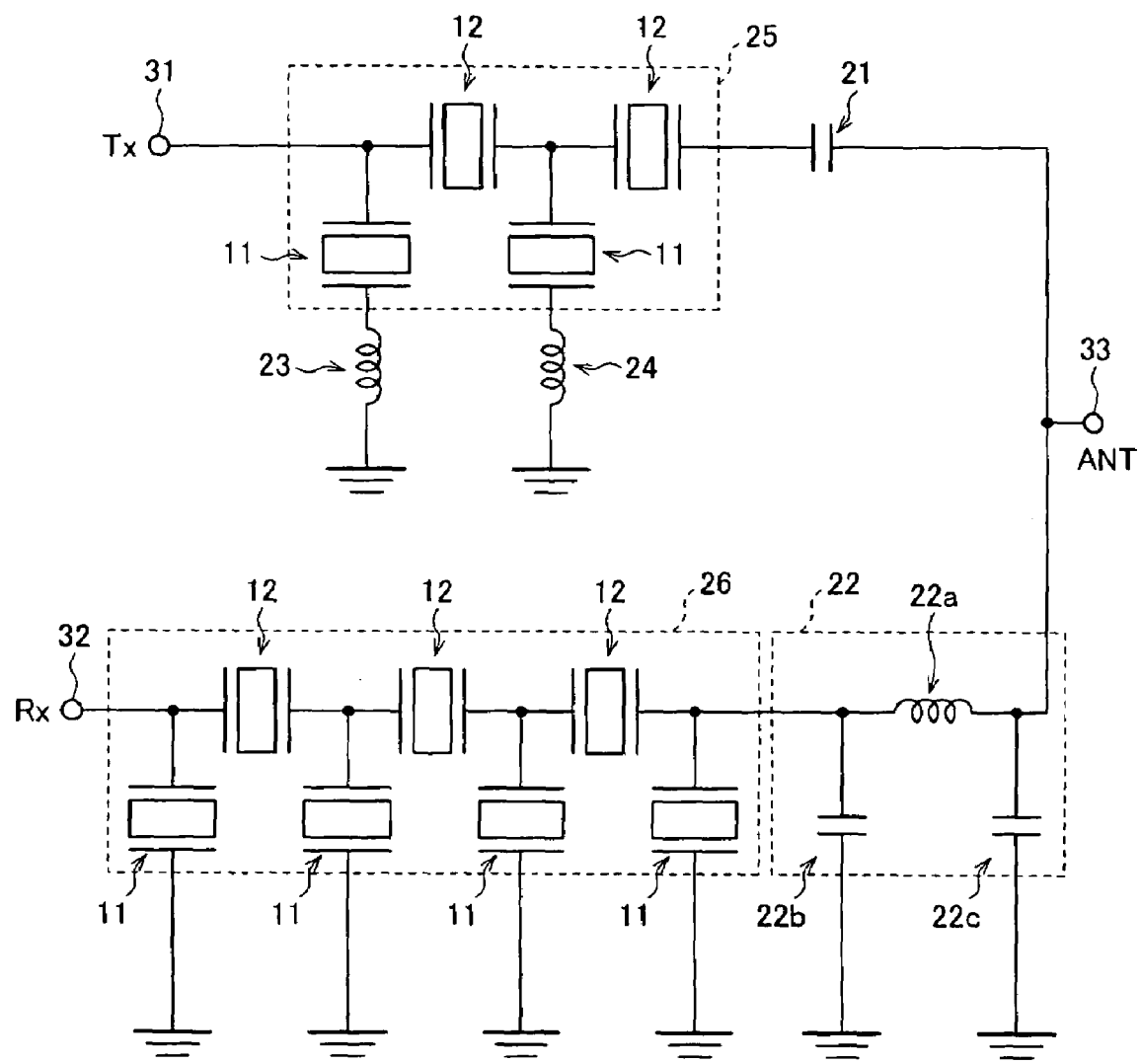
FIG. 12 is a circuit diagram showing one modified example of the branching filter.

In a filter in FIG. 11, a protective film 8 is further formed over the whole upper insulating film 6 in the modified example shown in FIG. 9. With such a construction, by etching the protective film 8 from the top, the frequency adjustment of the series resonator 12a and the parallel resonator 11 can be simultaneously made and the frequency of the filter as a whole can be adjusted to a desired value.

Moreover, in each of the above-described modified examples, a combination of the parallel resonator 11 having a second harmonic as the principal vibration and being excellent in sharpness on the lower-frequency side close to the passband, and the series resonator 12a having a fundamental wave as the principal vibration, the combination being suitable for the reception-side filter 26, is taken as an example. But a combination of a parallel resonator having a fundamental wave as the principal vibration (not illustrated) and the series resonator 12 having a second harmonic as the principal vibration may be used. In a ladder-type piezoelectric thin-film filter in which the parallel resonator having a fundamental wave as the principal vibration (not illustrated) and the series resonator 12 having a second harmonic as the principal vibration are combined, the sharpness on the higher-frequency side close to the passband can be improved so as to be suitable for the transmission-side filter 25.

Figure 13:
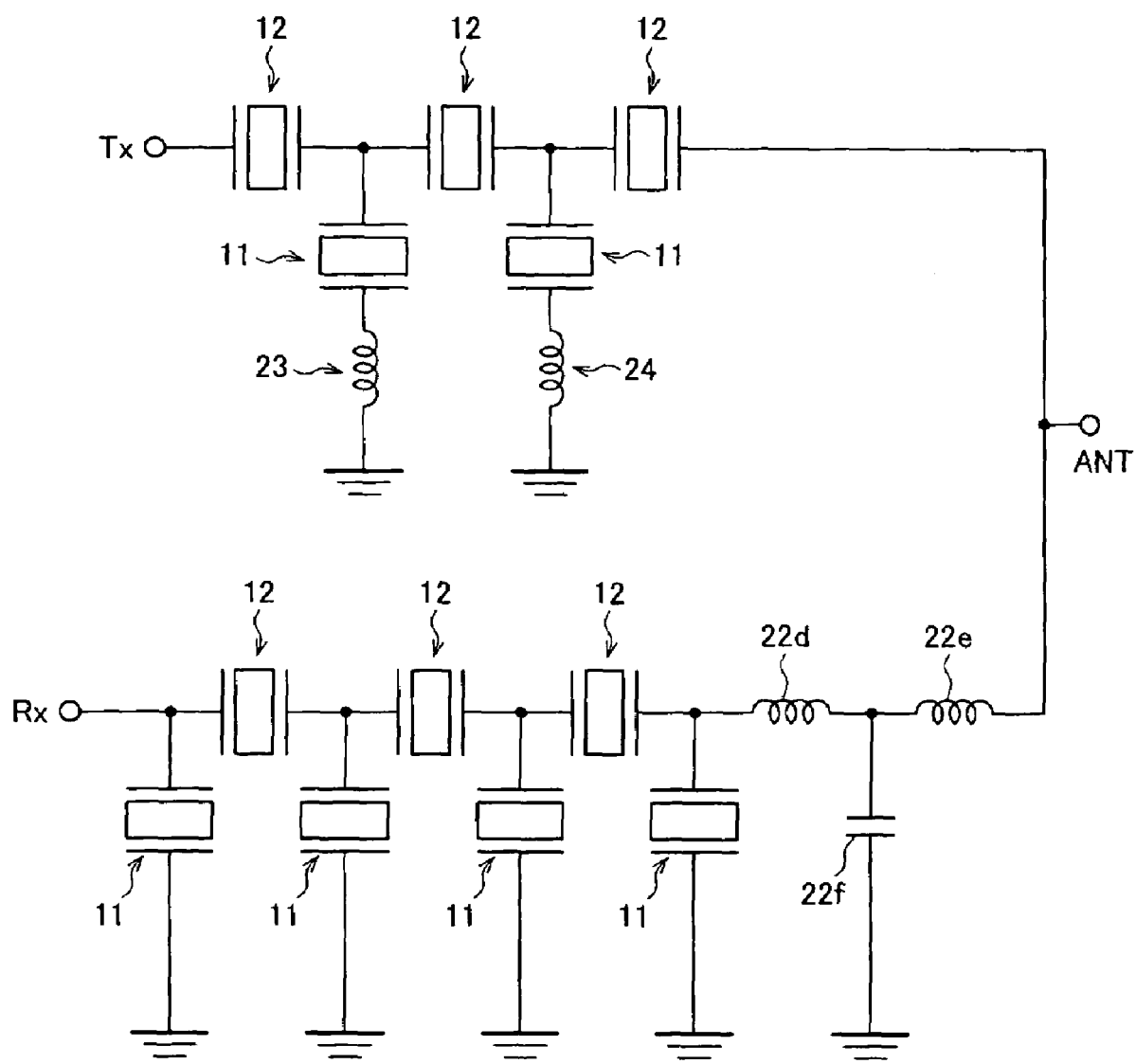
FIG. 13 is a circuit diagram showing another modified example of the branching filter.
Figure 14:
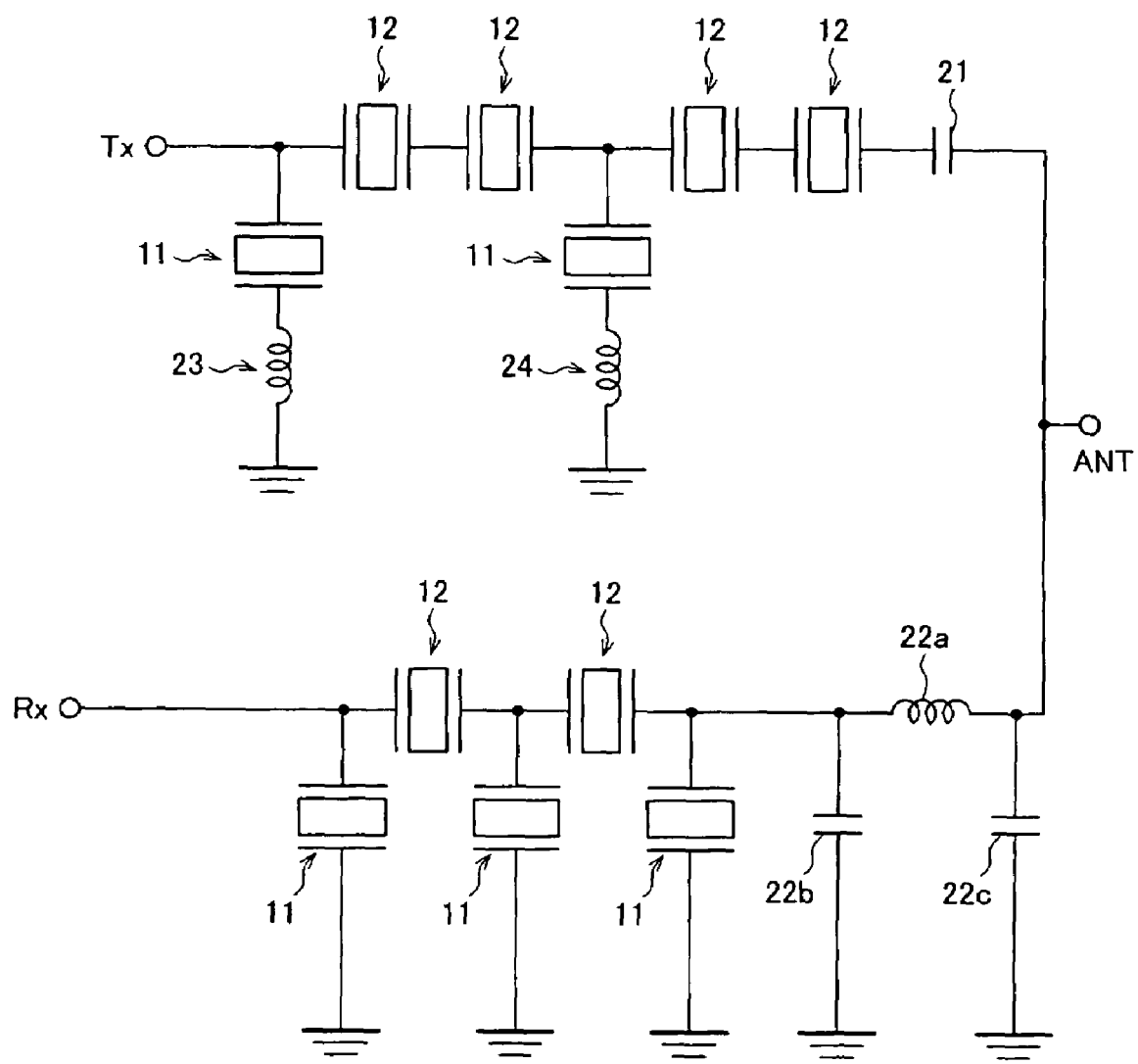
FIG. 14 is a circuit diagram showing another modified example of the branching filter.

Furthermore, in the first preferred embodiment, a branching filter having the circuit construction shown in FIG. 1 is taken as an example, but the branching filter is not limited to that. A branching filter having the circuit construction shown in FIGS. 12 to 14, for example, may be used. In FIG. 13, another matching circuit 22 including inductances 22d and 22e and a capacitance 22f are provided.

Moreover, in the above-described ladder-type piezoelectric thin-film filter, an opening portion 1a passing through the Si substrate 1 is provided as an example. But anything which does not prevent the vibrating portion from vibrating works well and, instead of the opening portion 1a, a concave portion may be arranged in the Si substrate 1 so as to face the vibrating portion.

Second Preferred Embodiment

Figure 15:
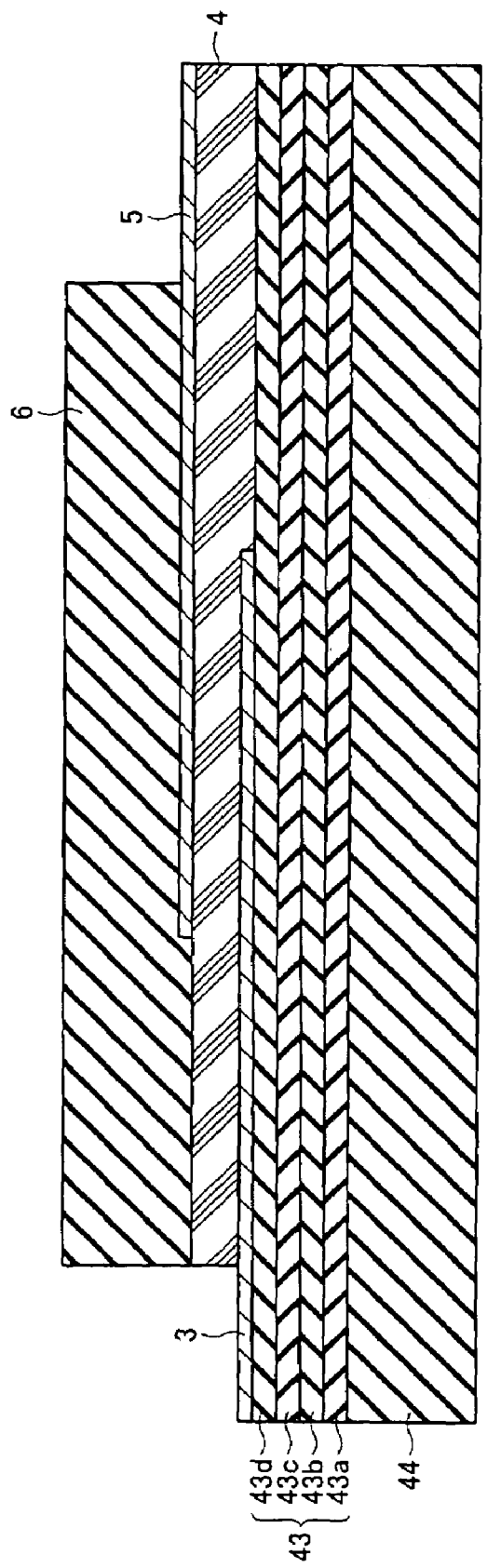
FIG. 15 is a sectional view of the essential portion of a piezoelectric thin-film filter included in a branching filter according to a second preferred embodiment of the present invention.

In a piezoelectric thin-film filter included in a branching filter according to a second preferred embodiment of the present invention, instead of the opening portion 1a and the concave portion described in the first preferred embodiment, as shown in FIG. 15, an acoustic reflective portion 43 is inserted between an Si substrate 44 corresponding to the Si substrate 1 and a vibrating portion formed on the Si substrate 44. The vibrating portion is a portion in which the piezoelectric thin film 4 is sandwiched between the lower electrode 3 and the upper electrode 5 in the same way as in the first preferred embodiment. The upper insulating film 6 may be further formed on the vibrating portion.

In the acoustic reflective portion 43, for example, AlN layers 43a and 43c and $SiO_2$ layers 43b and 43d having acoustic impedances different from each other are alternately laminated to increase the reflectance ratio. In order to increase the reflectance ratio, in the alternately laminated materials having different acoustic impedances, the larger the difference in acoustic impedance from each other, the more desirable.

When such an acoustic reflective portion 43 is provided, in the same way as in the first preferred embodiment, the vibrating portion can be acoustically separated from the Si substrate 44. In addition, in the above-described unique construction, since the vibrating portion is arranged so as to be in contact with the upper surface of the acoustic reflective portion 43, when compared with the case where the vibrating portion is formed on the opening portion 1a and the concave portion, the strength of the vibrating portion increases and, as a result, the yield and the reliability are improved and the resistance to power is also improved.

Accordingly, plural ladder-type filters can be formed by a combination of such piezoelectric thin-film filters to constitute a branching filter. In the obtained branching filter, the yield and the reliability are improved and the resistance to power can be also improved.

Moreover, in the first and second preferred embodiments, the piezoelectric thin-film resonators are preferably used as ladder-type filters. But the present invention is not limited to the piezoelectric thin-film resonators and, for example, surface acoustic wave resonators instead of the piezoelectric thin-film resonators may be used.

Third Preferred Embodiment

Next, in a communication device of a third preferred embodiment of the present invention, either of the ladder-type piezoelectric thin-film filters according to the first and second preferred embodiments or the above-described branching filters or any of the branching filters is mounted. A communication device is described with reference to FIG. 16. In the communication device 600, the receiver side (Rx side) for reception includes an antenna 601, an antenna-sharing portion/RF top filter 602, an amplifier 603, an Rx interstage filter 604, a mixer 605, a 1st IF filter 606, a mixer 607, a 2nd IF filter 608, a 1st and 2nd local synthesizer 611, a TCXO (temperature compensated crystal oscillator) 612, a divider 613, and local filter 614.

Figure 16:
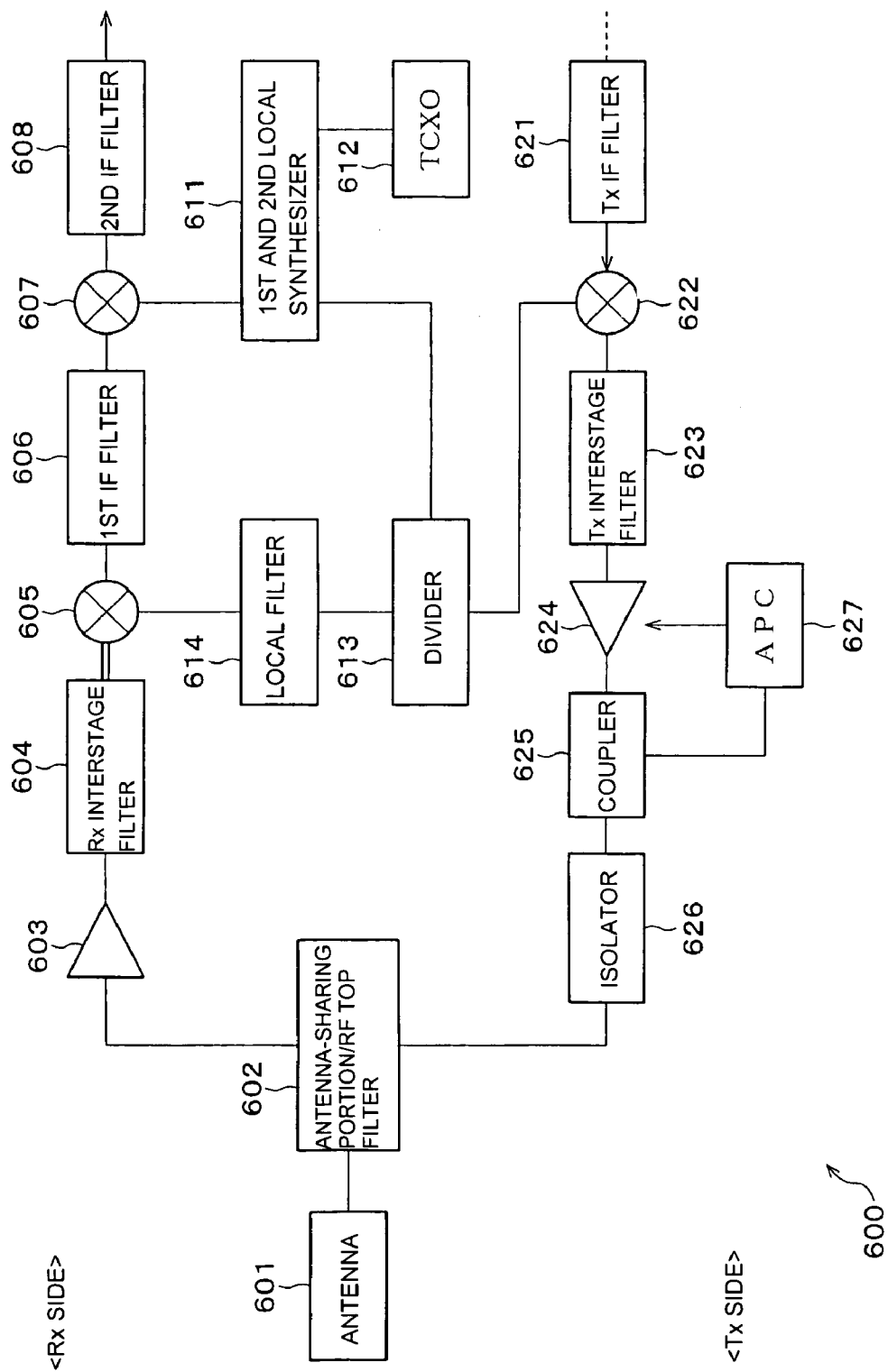
FIG. 16 is a block diagram of a communication device of a third preferred embodiment of the present invention.

As is shown by a double line in FIG. 16, it is desirable to send a balanced signal from the Rx interstage filter 604 to the mixer 605 in order to secure the balancing.

Furthermore, the transmitter side (Tx side) for transmission in the communication device 600 shares the antenna 601 and the antenna-sharing portion/RF top filter 602 and also includes a Tx IF top filter 621, a mixer 622, a Tx interstage filter 623, an amplifier 624, a coupler 625, an isolator 626, and an APC (automatic power control) 627.

Then, in the Rx interstage filter 604, 1st IF filter 606, Tx IF top filter 621, and Tx interstage filter 623, any of the ladder-type piezoelectric thin-film filters according to the first and second preferred embodiments can be suitably used, and in the antenna-sharing portion/RF top filter 602, any of the branching filters described in the first and second preferred embodiments can be used.

The ladder-type piezoelectric thin-film filters used in the branching filters of various preferred embodiments of the present invention can have a filtering function, excellent attenuation characteristics at least in the low-frequency side or the high-frequency side close to the passband, and excellent characteristics of being able to expand the passband. Accordingly, in a communication device according to a preferred embodiment of the present invention in which the above ladder-type piezoelectric thin-film filters and the branching filters including such ladder-type piezoelectric thin-film filters are mounted, the communication characteristics can be improved.

The excellent characteristics of a branching filter of various preferred embodiments of the present invention and a communication device including such a branching filter are that attenuation characteristics can be improved at least on the higher-frequency side or the lower-frequency side close to the passband and that the passband can be widened. Accordingly, the transmission characteristics of the communication device are improved and the communication device can be suitably used.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A branching filter serving as a ladder-type filter comprising:
   an antenna terminal;
   a first filter and a second filter having a passband higher than the passband of the first filter, the first and second filters being connected to the antenna terminal;
   a matching circuit positioned between the antenna terminal and the second filter; and
   at least one series resonator included in a series arm connecting an input terminal and an output terminal; and
   at least one parallel resonator included in at least one parallel arm connecting the series arm and a reference potential, the resonators being included in the first filter and second filter, respectively; wherein
   the second filter is a ladder-type filter in which the resonance frequency of the series resonator is higher than the antiresonant frequency of the parallel resonator;
   the impedance of a circuit in which the matching circuit is cascade-connected to the second filter is inductive in the passband of the second filter, when seen from the antenna-terminal side;
   the first filter is capacitive in the passband of the second filter; and
   because of the capacitive impedance of the first filter, the inductive impedance of the second filter is reduced, when seen from the antenna-terminal side.

2. A branching filter as claimed in claim 1, wherein a capacitance is inserted between the first filter and the antenna terminal.

3. A branching filter as claimed in claim 1, wherein the series resonator and parallel resonator include piezoelectric thin-film resonators, respectively.

4. A branching filter as claimed in claim 3, wherein the piezoelectric thin-film resonator includes a substrate, and a vibrating portion, being acoustically separated from the substrate, in which at least a pair of upper and lower electrodes arranged to face each other on the upper and lower surfaces of a thin-film portion having at least one layer of piezoelectric thin film so as to sandwich the thin-film portion.

5. A branching filter as claimed in claim 1, wherein, in the second filter, a piezoelectric thin-film resonator having an n-th harmonic, where n is an integer equal to two or more, as the principal vibration is used in at least one of the series resonator and the parallel resonator.

6. A branching filter as claimed in claim 1, wherein, in the second filter, a piezoelectric thin-film resonator having a fundamental wave as the principal vibration is used in one of the series resonator and the parallel resonator, and a piezoelectric thin-film resonator having a second harmonic as the principal vibration is used in the other of the series resonator and the parallel resonator.

7. A branching filter as claimed in claim 6, wherein, in the piezoelectric thin-film resonator having a second harmonic as the principal vibration, an insulating film is provided between the substrate and the lower electrode, and the insulating film has an amount of frequency change due to temperature changes that is different from that of the piezoelectric thin film.

8. A branching filter as claimed in claim 5, wherein the piezoelectric thin-film resonator having a second harmonic as the principal vibration includes an insulating film on the upper electrode.

9. A branching filter as claimed in claim 8, wherein the insulating film has an amount of frequency change due to temperature changes that is different from that of the piezoelectric thin film.

10. A branching filter as claimed in claim 8, wherein an intermediate insulating film is located between the upper electrode and the insulating film on the upper electrode.

11. A branching filter as claimed in claim 10, wherein the intermediate insulating film is also disposed on the upper electrode of the piezoelectric thin-film resonator having a fundamental wave as the principal vibration.

12. A branching filter as claimed in claim 5, wherein insulating films of the same material are provided on the upper electrode of the series resonator and the parallel resonator, respectively, and the insulating film on the upper electrode of the piezoelectric thin-film resonator having a second harmonic as the principal vibration is thicker than the insulating film on the upper electrode of the piezoelectric thin-film resonator having a fundamental wave as the principal vibration.

13. A branching filter as claimed in claim 1, wherein the series resonator and the parallel resonator each include a surface acoustic wave resonator.

14. A communication device comprising a branching filter as claimed in claim 1.

\* \* \* \* \*